United States Patent [19]

Denny et al.

[11] 4,034,353
[45] July 5, 1977

[54] COMPUTER SYSTEM PERFORMANCE INDICATOR

[75] Inventors: William Michael Denny, Santa Barbara; Russell Louis Hagen, Goleta; Steve Ka-Lai Leung, Santa Barbara, all of Calif.

[73] Assignee: Burroughs Corporation, Detroit, Mich.

[22] Filed: Oct. 29, 1975

[21] Appl. No.: 626,963

Related U.S. Application Data

[63] Continuation-in-part of Ser. No. 613,326, Sept. 15, 1975, Pat. No. 4,001,699.

[52] U.S. Cl. .............................................. 364/200
[51] Int. Cl.$^2$ ........................................ G06F 11/00
[58] Field of Search ................................ 340/172.5

[56]     References Cited
        UNITED STATES PATENTS

| | | | |
|---|---|---|---|
| 3,750,105 | 7/1973 | Raynham | 340/172.5 |
| 3,763,474 | 10/1973 | Freeman et al. | 340/172.5 |
| 3,771,144 | 11/1973 | Belady et al. | 340/172.5 |
| 3,904,860 | 9/1975 | Huber et al. | 235/153 AC |

Primary Examiner—Gareth D. Shaw
Assistant Examiner—C. T. Bartz
Attorney, Agent, or Firm—Nathan Cass; Kevin R. Peterson; Edward J. Feeney, Jr.

[57]     ABSTRACT

Computer monitor instructions are placed in appropriate locations in a routine to be monitored. Upon their execution, a decoder appropriately activates or de-activates circuitry, which develops time-related performance parameters. These time-related parameters are produced by a first counter which counts to one second and then resets a second, sampling counter. The sampling counter is stepped by clock pulses gated to it in response to a decoder activation signal. Each second the sampling counters contents are gated to a register to control the height of a bar graph display. Alternatively, the sampling counter contents may be summed over a number of intervals and divided by that number of intervals to produce an average count for controlling the bar graph display. Lastly, the number of decoder activations may be counted over the one second interval to provide a rate indication.

15 Claims, 10 Drawing Figures

*Fig. 8A*    MEMORY BOUND EXAMPLE

*Fig. 8B*    SCHEDULING EXAMPLE

DYNAMIC RATE OF FILE UPDATES

COMPUTER SYSTEM PERFORMANCE INDICATOR

CROSS REFERENCE TO RELATED APPLICATION

The application is a continuation in part of application Ser. No. 613326, filed Sept. 15, 1975 now U.S. Pat. No. 4001699, issued Jan. 4, 1977 and assigned to the present assignee.

BACKGROUND OF THE INVENTION

This invention relates to computer monitoring devices and more specifically to a computer performance indicator which provides a dynamic display of the internal operations of a computer.

In recent years several computer monitoring devices have been introduced. These devices have in part proven unsatisfactory because they have not been designed as an integral part of a computer system. Hence, such monitor devices were forced to exhibit a generality which has made them difficult to use in several ways.

Use of conventional monitor devices gives rise to complications because of the manner in which they interface with the monitored system. For example, conventional monitors modify basic logical operations done on data received from the computer by means of a wired plugboard. The use of such a plugboard to vary the way in which the computer monitor processes information has proven particularly confusing. Moreover, the wired connection between the monitored computer and the performance monitor usually has to be changed whenever the area to be measured changes. Furthermore, such computer monitors have generally been restricted to measuring hardware events or events easily detected by various accessible flip-flops or signal levels within the monitored system.

In addition, the output options available from such monitors have proven inadequate. Conventional monitors make their ouput computer-readable by writing it on magnetic tape or a similar media. There is no capability to feed the computer data directly back to the computer. Also, other monitors either force a user to select from a fixed group of time windows (2 seconds, 4 seconds, 16 seconds, etc.) over which performance is examined or else do not provide the capability to automatically divide the total time spent in a measured operation by the window time. The lack of an automatic division capability complicates the resultant display presented to the user. Overall, the above factors have resulted in computer monitors which only the most sophisticated users can appreciate.

SUMMARY OF THE INVENTION

It is therefore an object of the invention to provide an improved device for monitoring computer performance.

It is another object of the invention to provide a computer monitor which is readily understood by the ordinary computer user.

It is another object of the invention to eliminate the need for cumbersome and confusing plugboards and alternation of connections to the host computer in conjunction with a computer monitoring system.

It is yet another object of the invention to provide a monitoring device capable of making information directly available to the monitored computer or an independent computer through one of the computer I/O channels.

It is another object of the invention to provide a computer monitor which may selectively display several performance parameters such as the percentage of time the computer spends in a monitored process over a selected time interval, an average indication over several time intervals, or a rate count of events per second.

Lastly, it is an object of the invention to provide such indications in a dynamically changing display format, which is readily understood by computer users.

These and other objects and advantages of the invention are accomplished by utilizing the capability to bracket desired portions of the user code with computer monitor instructions. A task to be monitored is preceded by a first monitor instruction and immediately succeeded by a second monitor instruction. Upon performance of the first monitor instruction, a decoding takes place, causing the activation of particular timing circuitry elements. These timing circuitry elements run until the occurrence of the second monitor instruction or unitl internally produced signals cause cessation of operation. The timing circuitry drives particular display circuitry selected by the decoding function to provide a time parameter based display.

According to particular embodiments of the invention, several displays corresponding to different monitor instructions may be provided to monitor various tasks performed according to the user code. Similarly, various time-related parameters may be selected for display such as percentage of time spent in a particular process over an arbitrary interval, running average indication, or an indication of a number of events per second. The decoding function may be controlled by simple switches, thereby avoiding cumbersome plugboard arrangements. Finally the timing circuitry may be adapted to drive displays utilizing the very readily understood bar graph format.

BRIEF DESCRIPTION OF THE DRAWINGS

A specific manner of implementing the above summarized invention will now be provided in the following detailed description of the preferred embodiment of the invention read in conjunction with the drawings of which:

FIGS. 8A, 8B, and 8C illustrate particular uses of the performance indicator of the preferred embodiment.

DETAILED DESCRIPTION OF THE PREFERRED EMBODIMENT

Several modern computer systems contain a monitor instruction capability, which is exploited by the preferred embodiment of the subject invention. One such system is the Burroughs B 1700 computer system. According to this capability, monitor instructions may be placed in instruction routines and detected at outputs of the computer.

Figure 1:
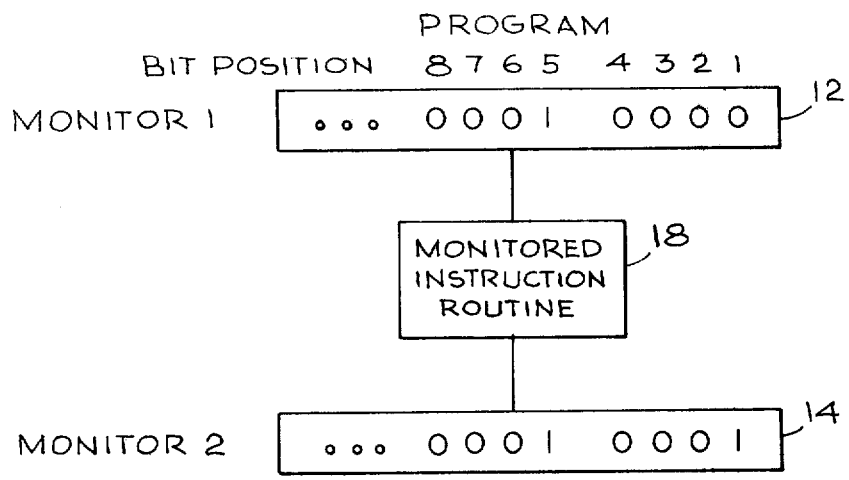
FIG. 1 is an illustration of the instruction bracketing technique of the preferred embodiment of the invention.

According to the invention, initiating and terminating monitor instructions are used to bracket those instructions comprising a task to be monitored. Such an arrangement is illustrated in FIG. 1 where the initiating monitor instruction 12 includes low order eight bits 0001 0000 and the terminating monitor instruction 14 includes low order eight bits 0001 0001. When such a monitor instruction 12, 14 is performed, a monitor pulse is produced by the computer. The production of this monitor pulse enables transfer of the low order eight bits from the instruction register of the monitored computer to the computer performance indicator device. In the B 1700, the hardware monitor micro-op facilitates loading the performance indicator register.

Figure 2:
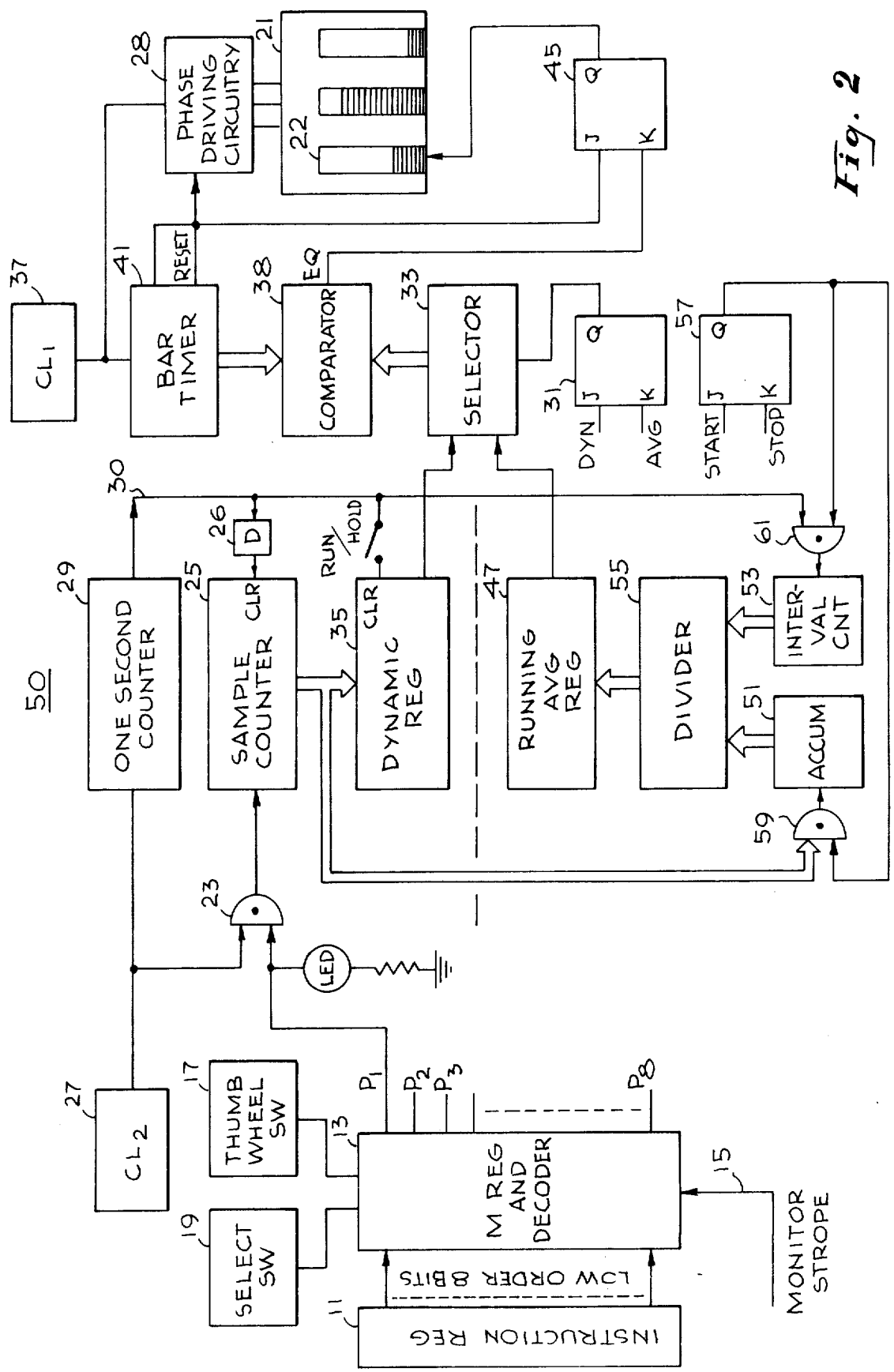
FIG. 2 is a schematic diagram of the performance indicator of the preferred embodiment of the invention.

As illustrated in FIG. 2, the low order eight bits of the instruction register 11 are transferred to a monitor register and decoder 13 upon the occurrence of the monitor strobe on line 15. As may be seen, the monitor register and decoder 13 has eight outputs $P_1, P_2, \ldots P_8$, each of which drives related timing and display circuitry. In FIG. 2, only the timing and display circuitry associated with the decoder output $P_1$ is illustrated; however, identical circuitry and display is provided for each of the other decoder outputs $P_2 \ldots P_8$.

Switches are then provided to select which of the outputs $P_1, P_2 \ldots P_8$ are activated or de-activated by particular bit combinations supplied to the decoder 13. Thumb wheel switches 17 are provided to select the low order 4 bits, and select switches 19 are provided to select the high order 4 bits. By proper selection of the thumb wheel switch positions and the select switch positions the decoder 13 can be made to operate such that when the initiating monitor instruction 12 of FIG. 1 is detected a signal appears on the line $P_1$ and when the terminating monitor instruction 14 is detected that output will cease. In general, proper selection of the positions of the thumb wheel switches 17 and the select switches 19 controls which of the decoder outputs $P_1, P_2 \ldots P_8$ is activated by a particular incoming code combination. The operation and construction of the monitor register and decoder 13 will be more fully detailed at a later point in this discussion.

When the decoder output $P_1$ is activated, the associated timing circuitry 50 is energized. This circuitry 50 develops a control signal for controlling the height of a luminous bar 22 in a bar graph display 21.

Figure 3:
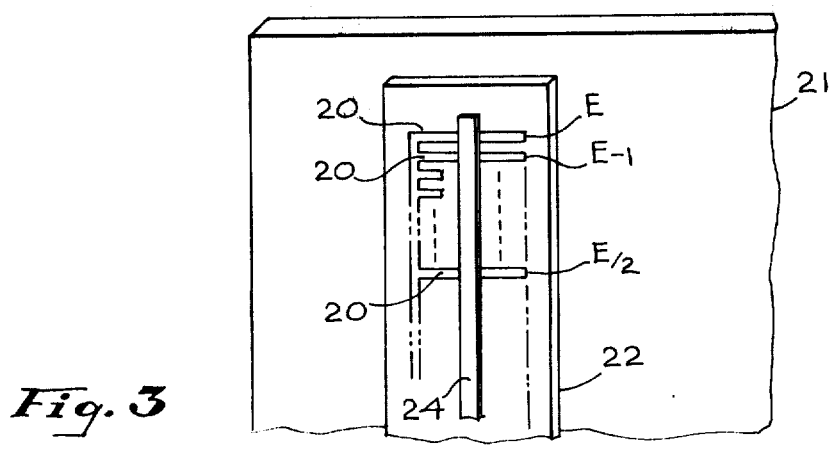
FIG. 3 is a pictorial diagram of the bar graph display used in the preferred embodiment of the invention.

As shown pictorially in FIG. 3, the bar 22 in the bar graph display 21 includes a number E of cathode segments 20 which are successively energized by phased clocking provided by a clock 37 and phase-driving circuitry 28. To maintain a display constant to the eye the E segments are successively energized sixty times per second. The clock 37 is set at a frequency of (60) (E) Hz. Associated with the clock 37 is a bar timer 41 set to count to E and reset. At any time, its count represents the particular cathode segment 20 under activation by the driving circuitry 28.

A cooperating transparent anode element 24 overlies the cathode elements 20. As long as the anode element is activated, glow is propagated successively up the bar graph towards the last element E. However, when the anode is de-activated luminescence ceases to propagate and hence the heights of the bar is determined as some fraction of E. Therefore, the function of the timing circuitry is to properly control the activation of the anode electrode 24. The manner of providing phased clocks to the display 21, as well as the manner of constructing the display 21 itself, is well known in the art.

The timing circuitry of the preferred embodiment indicated in FIG. 2 provides two timing functions. The first is the dynamic mode wherein the display illustrates the percentage of time the first decoder output $P_1$ is activated during a one second interval. Successive one second interval percentages are displayed. In the second or running average mode, the percentage of activation time over successive one second intervals is accumulated and divided by the total number of one second intervals to provide a running average of the time spent by the computer in processes which activate the first decoder output $P_1$.

To provide these modes, the timing circuitry employs an AND gate 23 through which a clock 27 may step a sample counter 25. The clock 27 also steps a one second counter 29. Thus, when the output $P_1$ to the AND gate 23 is high, clock pulses are passed from the clock 27 to the sample counter 25. Therefore, if the output $P_1$ is high for one half second during a one second interval the sample counter 25 will count only one half as many pulses from the clock 27 as will the one second counter 29. Thereby, a percentage indication is developed.

Because of the nature of operation of the bar graph display, a particular relationship is chosen to exist between the frequency of clock 27, the length of the one second counter 29 and the length of the sample counter 25. To properly coordinate with the successive activation of E cathode elements, the frequency of clock 27 is chosen to be $E \times 2^N$ where N is an integer 0, 1, 2 .. . The one second counter 29 is thus chosen to count to that same number $E \times 2^N$, and the sample counter 25 is made long enough to count to at least $E \times 2^N$.

To operate in the dynamic mode, a J-K flip-flop 31 is set to cause a selector network 33 to gate the contents of the dynamic register 35 to a digital comparator 38. The selector 33, is merely a series of AND gates which select which register 47, 35 is to have its contents inputted to the digital comparator 37. The other input to the digital comparator 37 is the count of the bar timer 41.

Thus, for example, if the frequency of the clock 27 is selected to be E Hz, i.e., $N = 0$, and the decoder output $P_1$ is activated for one half of a one second interval, the sample counter 25 will count to E/2. Over the same interval, the one second counter 29 will count to E, producing an output signal on line 30 which will transfer the count of the sample counter 25, E/2, to the dynamic register 35. A delay means 26 causes the signal on line 30 to clear the sample counter 25 after its contents E/2 are transferred to the dynamic register 35.

For the next one second interval during which the one second counter 29 is counting, the contents of the dynamic register, E/2, are supplied to the digital comparator 37 and compared to the 60 count sweeps of the bar timer 41. Each time that the bar timer count reaches the count of E/2 an output by the comparator 38 will reset the J-K flip-flop 43 to de-activate the anode 24 of the bar graph display 21, thereby fixing the bar height at one-half E. After each successive cycle of cathode element energization, the J-K flip-flop is set by the bar timer 41.

The running average mode operates similarly, and is selected by activating the running average switch on the J-K flip-flop 31. This selection gates the contents of the running average register 47 to the comparator 38 instead of the contents of the dynamic register 35. The duration of the running average mode is an arbitrary interval as determined by start and stop inputs to a J-K flip-flop 57. Selection of the start input initiates operation of an accumulator 51 and a divider 55 by means of two AND gates 59, 61. A tap off the count of the sample counter 25 is transferred to the accumulator counter 51 via the enable AND gate 59. The output pulse of the one second counter 29 also increments the interval counter 53 via the enable AND gate 61. The accumulator sums each successive count of the sample counter 25, and the interval counter 53 maintains a count of the number of one second intervals over which the sample counter 25 has been activated.

The output of the divider 55 is therefore the quotient produced when the total number of one second intervals is divided into the total number of samples counted over that total number of one second intervals. That quotient is then presented to the comparator 38 by the running average register 47 through the selector network 33 to control the bar graph display 21 as previously discussed.

Figure 4:
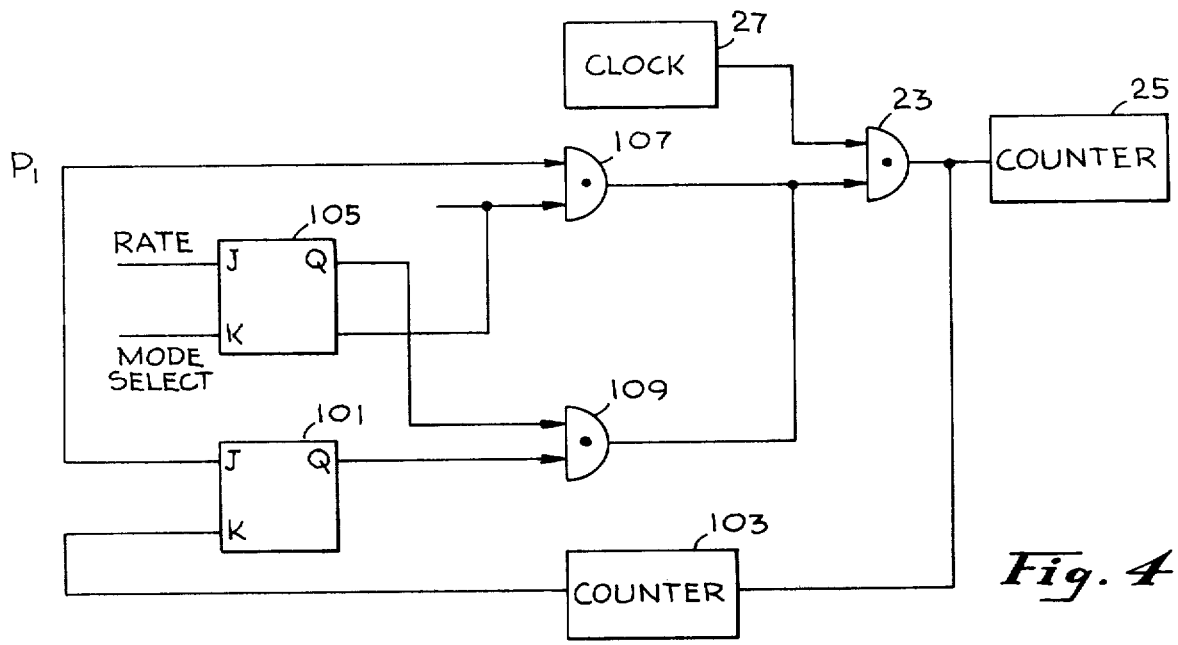
FIG. 4 is a schematic diagram of timing circuitry usable in the preferred embodiment for producing a rate count.

The timing circuitry 50 just discussed may be modified as in FIG. 4 to provide a rate count. The modifications entail provision of a counter 103 and a J-K flip-flop 101. By provision of a switch such as a flip-flop 105, and two AND gates 107, 109, the rate function may be directly coupled with the AND gate 23, counter 25 and other circuitry of FIG. 2.

With the AND gate 109 enabled by selection of the rate mode, each time an initiating monitor instruction 12 is detected, the flip-flop 101 is set, enabling the AND gate 23. The pulses from the clock 27 gated through the AND gate 23 are counted by the counter 103. This counter is set to count an arbitrary number of pulses and reset the flip-flop 101 before another initiating monitor instruction occurs. Therefore, each time the particular initiating monitor instruction occurs, a fixed number of pulses increments the sample counter 25. The total count of the counter 25 then represents the number of monitor instructions or events encountered per second.

Figure 5:
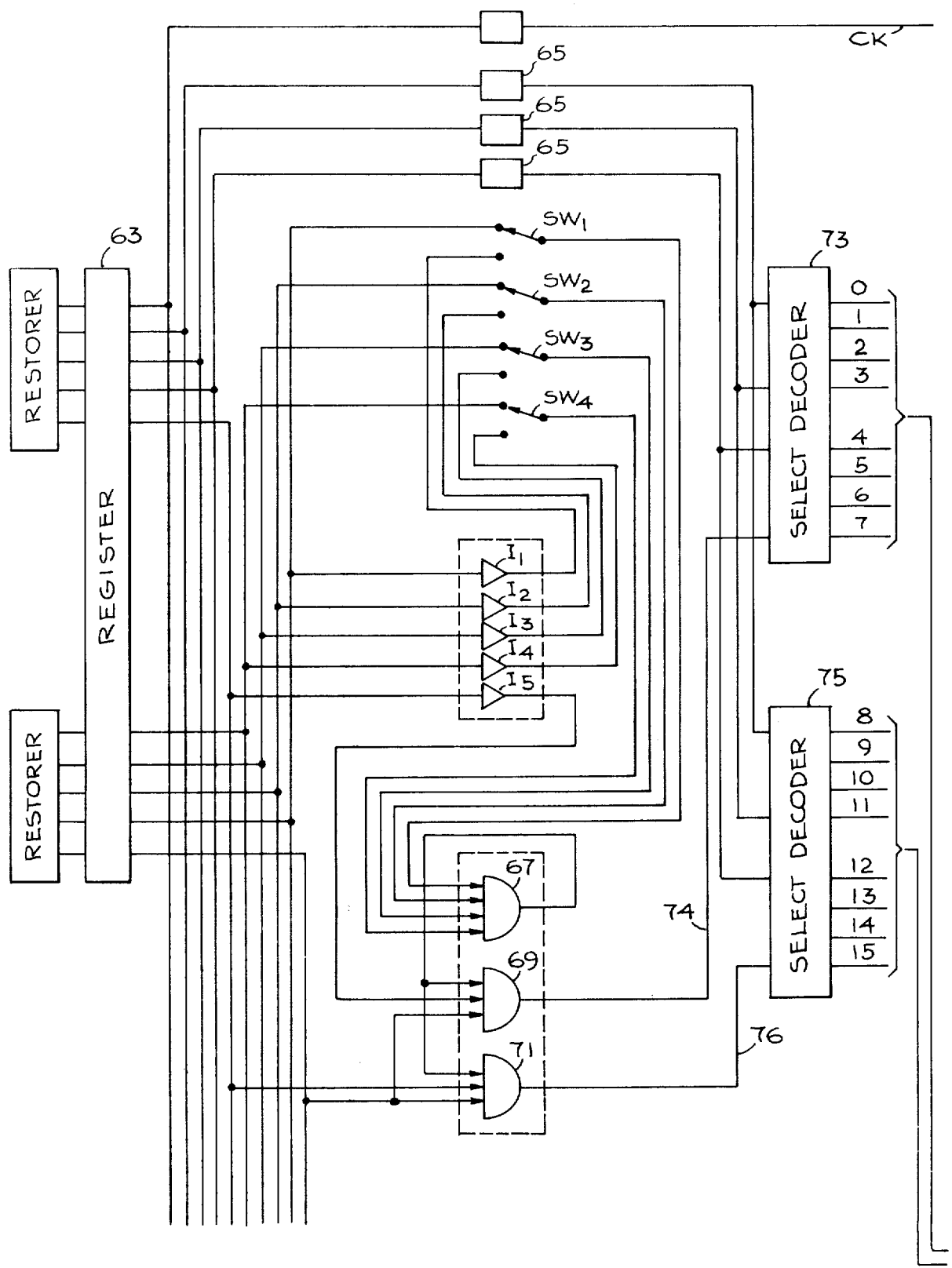
FIG. 5 is a schematic diagram of the first half of the instruction decoder circuitry of the preferred embodiment of the invention.
Figure 6:
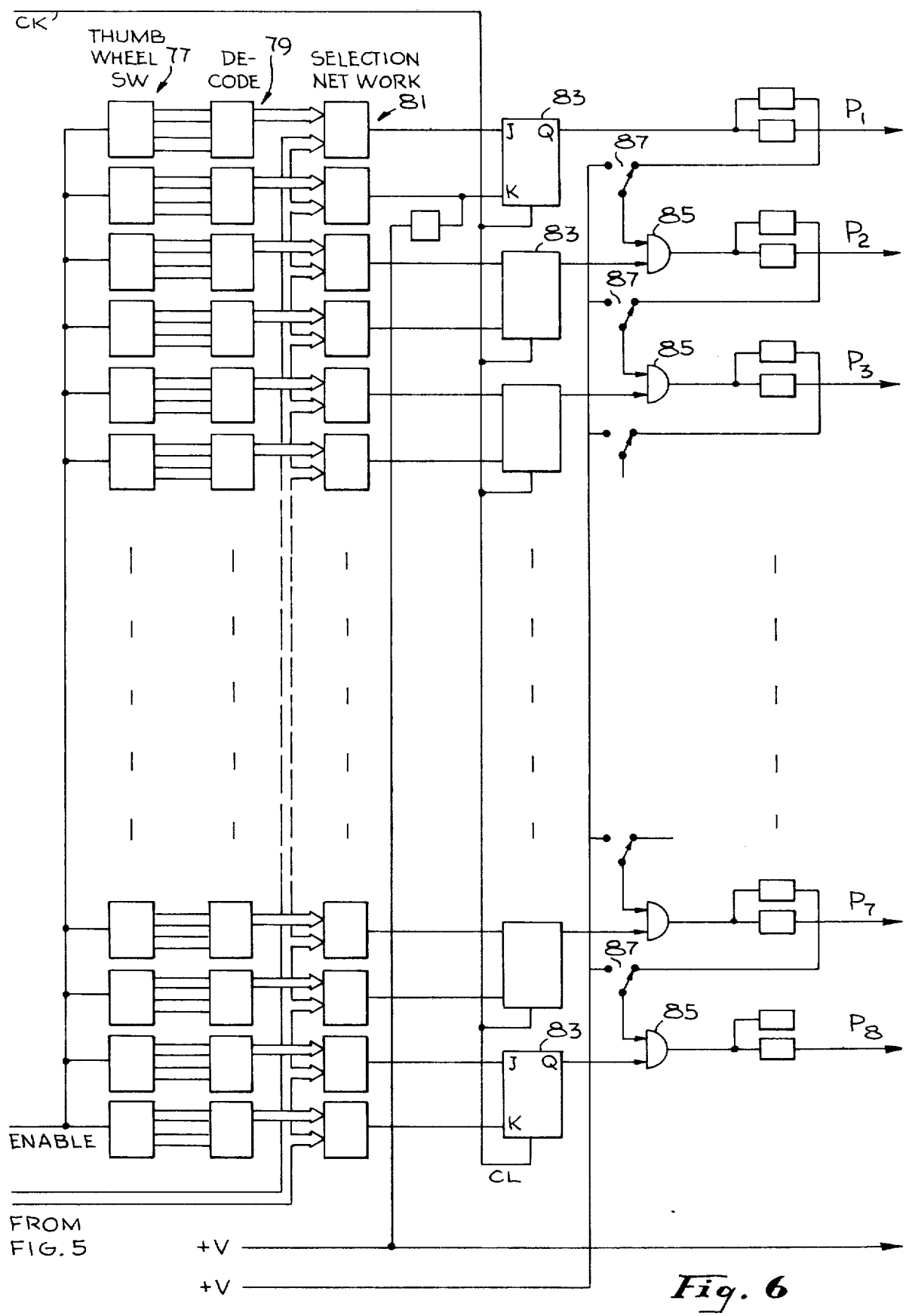
FIG. 6 is a schematic diagram of the second half of the instruction decoder circuitry of the preferred embodiment.
Figure 7:
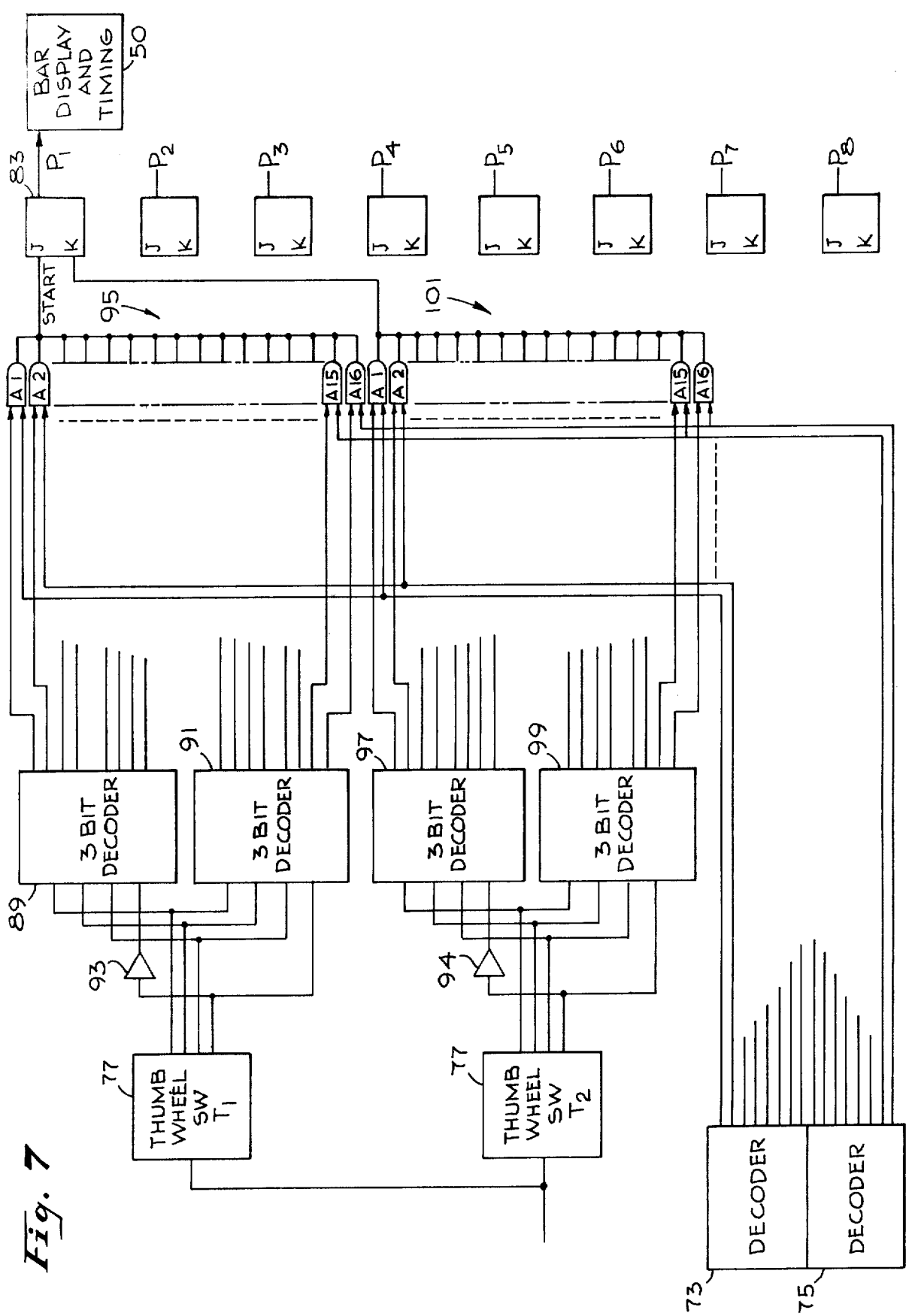
FIG. 7 is a more detailed view of a portion of the schematic of FIG. 6.

The decoder circuitry 13 and associated thumb wheel switches 17 and select switches 19 are shown in greater detail in FIGS. 5, 6 and 7. The circuitry of FIG. 5 operates to select the combination of the four high order bits (bits 5–8 in FIG. 1) which will activate the display. This selection is made through the cooperation of a number of select switches $SW_1$, $SW_2$, $SW_3$, $SW_4$, and a number of inverters $I_1$, $I_2$ . . . $I_5$, which supply three AND gates 67, 69, 71.

The outputs of these AND gates 67, 69, 71 determine which of the two decoders 73, 75 is to be enabled by control line 74, 76. Each of these decoders 73, 75 is supplied with the low order three bits from the register 63 through respective restorers 65. The restorers simply serve to provide amplification and isolation between the register 63 and the decoders 73, 75. The decoders 73, 75 are each 3 bit decoders providing a total of 16 outputs between them. They are respectively activated by an output signal on two control lines 74, 76 from the AND gates 69, 71.

The functioning of the circuitry of FIG. 5 may be illustrated by discussion of its response to the monitor instructions of FIG. 1 where the high order 4 bits are 0001. To select this combination, the select switches are correspondingly set to 0001. Thus, the three highest order bits 000 are switched through inverters $I_1$, $I_2$, $I_3$ to the AND gate 67, while the fifth order bit 1 is fed directly to the AND gate 67, resulting in a 1 output from that AND gate 67. This 1 output then forms a first input to the other AND gates 69, 71. As second and third inputs, the AND gate 69 is supplied with the monitor strobe enable pulse and the inverted value of the highest of the low order 4 bits. The AND gate 71 is supplied with the uninverted value of the highest of the lower 4 bits and also with the strobe enable pulse.

Since the fourth bit of the first monitor instruction 12 is a 0, the AND gate 69 is enabled, causing the decoder 73 to operate and decode the first 3 bits of the monitor instruction. In this case, the decoded value of the first 3 bits of monitor instruction 12 is a 0 and an output occurs on the first output of the decoder 73. The decoded value of the first three bits of instruction 14 is a 1 and the second output of the decoder 73 would therefore be activated. If the decoded value of the first four digits were to be above 8, of course, the decoder 75 would be enabled by an output from the AND gate 71.

In summary, the switches $SW_1$, $SW_2$, $SW_3$, $SW_4$; the inverters $I_1$, $I_2$, $I_3$, $I_4$, $I_5$ and the AND gate 67 serve to select the high order 4 bits. If, in the above example, those last four bits were not 0001, the output of the AND gate 67 would be low and neither AND gate 69, 71 could activate its associated decoder 73, 75. However, when the proper 4 bits appear in bit positions 5–8 of the monitor register 63, the two AND gates 69 and 71 serve to choose the proper decoder 73, 75 to provide correct decoding of the lower 4 bits into one of 16 possible outputs.

The thumb wheel switches 77, thumb wheel switch decoders 79 and selection networks 81 then determine which, if any, of the particular 8 bar graph displays will be activated by the lower 4 bit combination in positions 1–4 of FIG. 1. In response to a proper lower 4 bit combination, these elements 77, 79, 81 will actuate a particular one of the flip-flops 83 to produce a signal on one of the outputs $P_1$, $P_2$ . . . $P_8$ of the decoder 13. A number of AND gates 85 and associated switches 87 then permit logical operations on the selected outputs of the flip-flops 83.

The operation of the thumb wheel switch circuitry 77, 79, 81 may be better understood with reference to FIG. 7. Each thumb wheel switch 77 is settable from 1 to 16 and produces a 4 bit output. Two 3 bit decoders 89, 91 and an inverter 93 are used to decode the 4 bit output of the thumb wheel switch $T_1$ into an output on one of 16 lines to respective AND gates in a string of AND gates 95. The second thumb wheel switch $T_2$ supplies identical circuitry, including two decoders 97, 99 supplying a second string of 16 AND gates 101. As may be seen, the first AND gate $A_1$ in each string 95, 101 receives an input from the first output of the decoder 73, the second AND gate $A_2$ in each string 95, 101 receives an input from the second output of the decoder 73 and so on. The outputs of each of the 16 AND gates 95 are connected to the J input of a J-K flip-flop 83 to activate a bar graph timing circuit 50 associated with decoder output $P_1$. The outputs of the 16 AND gates 101 are connected to the K input of that J-K flip-flop 83 to disable the activation of the associated timing circuitry 50.

Continuing the example utilizing the monitor instructions 12, 14 of FIG. 1, it will be remembered that the first monitor instruction 12 supplied an output from the first output of the decoder 73 and the second monitor instruction an output from the second output of the decoder 73. If it is then desired that the first bar 20 of the display 21 represent the performance of the monitored routine instructions 18 of FIG. 1, the first thumb wheel switch $T_1$ is set to 0000 and second thumb wheel switch $T_2$ is set to 0001. Since the first thumb wheel switch $T_1$ is set to zero, the 4 outputs to the decoders 89, 91 are 0000. A "1" is then supplied by the inverter 93 to the decoder 89 enabling that decoder 89. The resultant output is an output on the first line of the decoder 89 indicating a decoded 0. This input is then supplied to the first AND gate $A_1$ of the string 95 together with the first output signal of the decoder 73. The first AND gate, $A_1$ in the string 95 is therefore supplied with two high inputs, resulting in an output to the J input of the J-K flip-flop 83. This flip-flop 83 is thereby set, resulting in activation of the bar display timing circuitry 50 connected to the decoder output line $P_1$.

This activation continues while the monitored routine instructions 18 of FIG. 1 are being performed. When these instructions have been performed, the second monitor instruction 14 will be performed. Since the first 4 bits of the second monitor instruction are 0001, an output appears on the second output line of the decoder 73, as previously discussed. This output is supplied to the second AND gate $A_2$ in the string of AND gates 101, and to the second AND gate $A_2$ in the string of AND gates 95. Since the thumb wheel switch $T_2$ is set to a value of 1, the decoder 97 is enabled and an output appears on the second output line which is supplied to the second AND gate $A_2$ in the line of AND gates 101. Hence, this second AND gate $A_2$ outputs a positive pulse resetting the output $P_1$ of the J-K flip-flop 83 and terminating the operation of the associated bar graph timing circuitry 50. Since the first thumb wheel switch $T_1$ is set to zero, the second AND gate $A_2$ in the string of AND gates 95 exhibits no output.

Figure 8C:
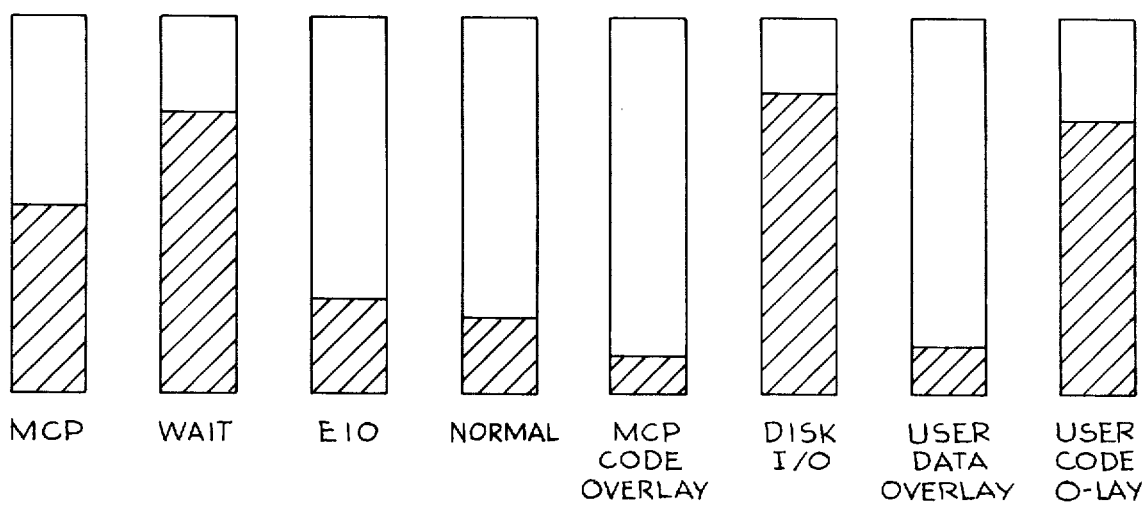
Figure 8C:
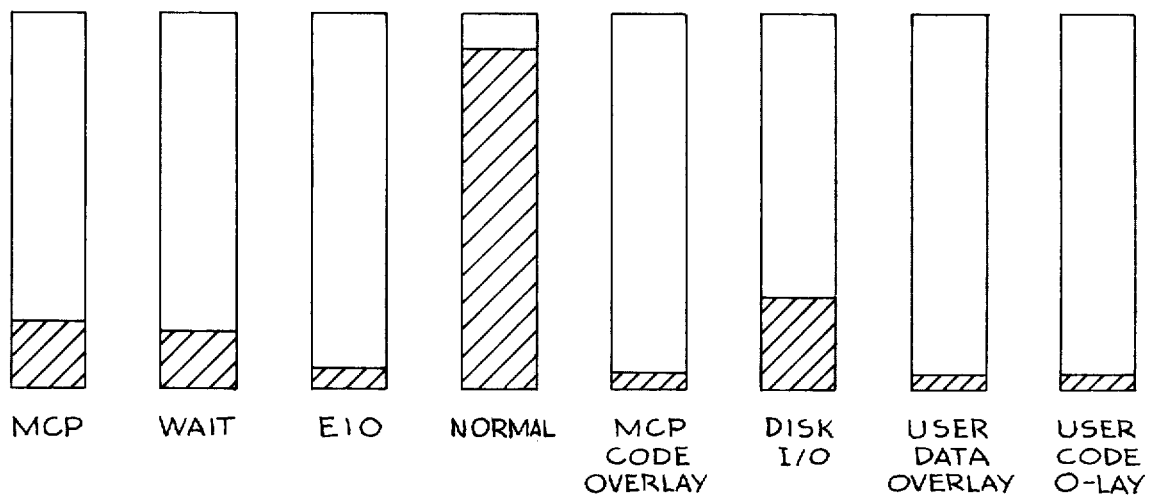
Figure 8C:
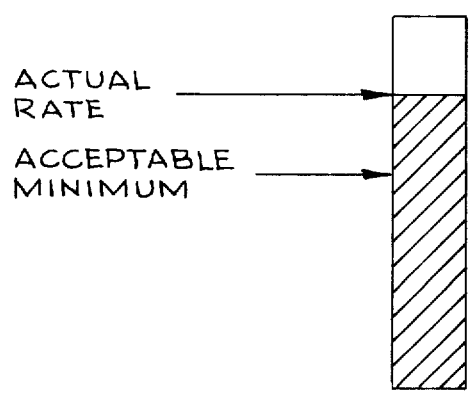

The utility of the subject invention may be better understood with reference to FIGS. 8A, 8B and 8C. Each of these figures shows eight bar graphs each monitoring a particular computer parameter. These bars respectively display relative percentages of time spent in MCP, wait, enhanced I/O activity, processor normal state, MCP code overlays, disc I/O, user data overlay, and user code overlay.

In FIG. 8A the bars indicating user code overlays, disc I/O and wait are quite high, while the bars indicating enhanced I/O activity and normal state are low. This pattern indicates that the system is spending large amounts of time waiting for user code overlays from disc, indicating that the system is memory bound and improved processing could be obtained by addition of more memory.

As another example, consider FIG. 8B which indicates how the monitor would be useful in operator scheduling. If an operator displaying the standard events runs two programs together and the display appears as in FIG. 8B, it would be immediately obvious to him that the programs were processor bound and were not good candidates to run together. Removing one job and adding another job with more I/O might result in increased multi-programming throughput.

The monitor may also prove useful to supervisors, especially in real time situations, such as reader/sorter check transactions processing. In such applications, a constantly updated visual display of whatever events the user deems appropriate is available. The user can see at a glance what his document sorted rate is or his transaction rate or error rate is and take appropriate action immediately instead of at the end of the day. As illustrated in FIG. 8C, the user may choose to display the rate at which an update program updates master file records as a measure of system throughput. An operator can now be instructed that when running this job he may keep adding jobs to the mix until this rate drops below some acceptable minimum point to better utilize the system or to guarantee a job's completion on time.

The uses for the computer performance indicator of the invention are multifarious and innumerable. Programmers will be able to improve their own programs with less technical assistance. They will also have a quantitative indication of the throughput rate of various user programs. Users will have a visible quantitative indications of the need for more memory, faster discs and other equipment. The operator and operations manager will be able to modify the mix and schedule of jobs for improved throughput based on indications from the monitor. Moreover, improvements in software will be more apparent and readily testable.

Lastly, it is to be understood that the above detailed description only discloses the preferred embodiment for practicing the invention and many departures from that embodiment may be made without departing from the scope and spirit of the invention. It is therefore to be understood that, within the scope of the appended claims, the invention may be practiced otherwise than as specifically described.

What is claimed is:

1. In association with a digital computer wherein an instruction routine may include an initiating monitor instruction, a computer performance monitor comprising:
   means for producing a display activation signal from said initiating monitor instruction indicative of the performance of a predetermined operation of said computer occurring subsequent to said initiating monitor instruction;
   timing means activated by said display activation signal for developing a second signal whose value represents a time-related parameter indicative of the performance of said predetermined operation of said digital computer occurring subsequent to said initiating monitor instruction; and
   means coupled to said timing means for providing a humanly readable display in response to said second signal.

2. The computer monitor of claim 1 wherein a said initiating monitor instruction is accessible at an instruction register in said computer and wherein said producing means includes:
   means for producing said activation signal in response to the decoding of a selected bit pattern of a said initiating monitor instruction when said monitor instruction is in said instruction register.

3. The computer monitor of claim 2 wherein said timing means includes:

means for producing an indication of the number of said display activation signals produced over a selected time interval.

4. The computer monitor of claim 3 wherein said display means comprises:
a bar graph display wherein the illuminated bar height is determined by a control signal; and
means responsive to said second signal for producing said control signal to terminate the illuminated portion of said bar at a height proportional to said indication.

5. The invention in accordance with claim 4, wherein a plurality of computer performance monitors are provided, each with its own bar graph display, and wherein said monitors are constructed and arranged to produce displays on their respective bar graphs indicative of time-related parameters relating to different predetermined operations of said computer.

6. The computer monitor of claim 1 wherein said instruction routine may also include a terminating monitor instruction used with a said initiating monitor instruction to bracket a routine to be monitored, and wherein said producing means further includes means for terminating said display activation signal upon occurrence of said terminating monitor instruction.

7. The computer monitor device of claim 6 wherein said producing means comprises:
means for decoding respective selected bit patterns of said initiating and terminating monitor instructions to respectively produce and terminate said display activation signal.

8. The computer monitor device of claim 7 wherein said timing means includes:
means for developing an indication of the fraction of a selected time interval during which said display activation signal is present.

9. The computer monitor of claim 8 wherein said display means comprises:
a bar graph display wherein the illuminated bar height is determined by a control signal; and
means for producing said control signal to terminate the illuminated portion of said bar at a height proportional to said indication.

10. The computer monitor of claim 7 wherein said timing means includes:
means for developing an indication of the average time over a number of time intervals that said display activation signal is present.

11. The computer monitor of claim 10 wherein said display means includes:
a bar graph display wherein the illuminated bar height is determined by a control signal; and
means for producing said control signal to terminate the illuminated portion of said bar at a height portional to said indication.

12. A computer performance indicator for use in conjunction with a computer having a monitor instruction capability comprising:
detecting means for detecting occurrence of an initial monitor instruction and a terminal monitor instruction in the computer program and for providng a representation of at least a predetermined portion of each such detected instruction at the output thereof;
decoding means coupled to the output of said detecting means for decoding said initial monitor instruction to produce a display activation signal, and for decoding said terminal monitor instruction to remove said display activation signal, said display activation signal representing a time-related parameter indicative of the performance of a predetermined operation of said computer occurring between said initial and terminal monitor instructions;
means coupled to the output of said decoding means for developing an electrical indication representing the state of said activation signal over a selected time interval occurring between said initial and terminal monitor; and
means responsive to said electrical indication for providing a humanly readable display representative of said indication.

13. The invention in accordance with claim 12, wherein said means for developing an electrical indication includes means for causing said electrical indication to represent the percentage of an arbitrary interval spent by said computer between production of a said activation signal and subsequent removal of that signal.

14. The computer performance monitor of claim 12 wherein said means for developing an electrical indication includes means for causing said electrical indication to represent an average indication over a predetermined number of time intervals of the time spent by said computer in the performance of said predetermined operation.

15. The invention in accordance with claim 12, wherein said means for developing an electrical indication includes means for causing said electrical indication to represent the number of times that said predetermined operation is performed over a selected time interval.

* * * * *